Figure 1:
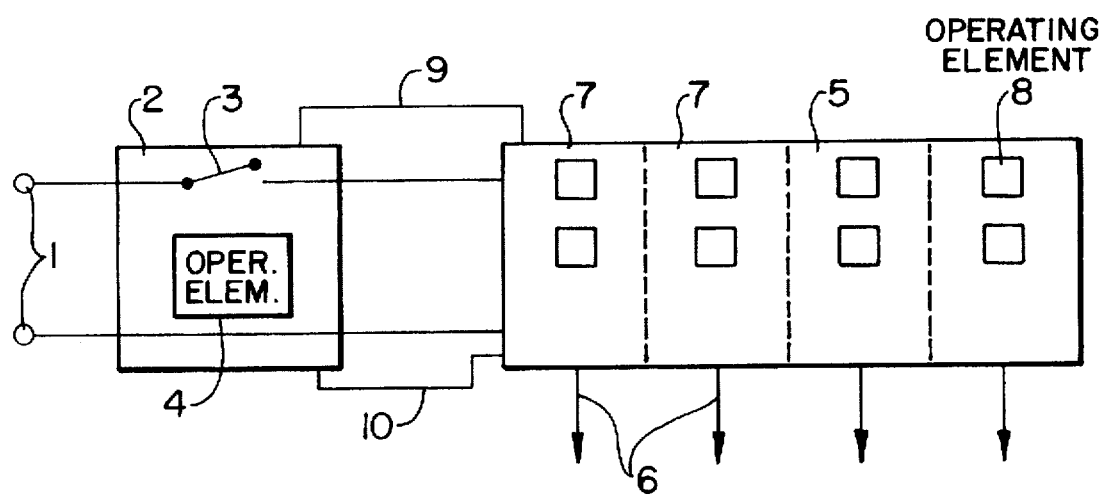

United States Patent [19]
Goetz et al.

[11] Patent Number: 5,717,189
[45] Date of Patent: Feb. 10, 1998

[54] CONTROL ARRANGEMENT FOR AN ELECTRIC HEATING APPLIANCE

[75] Inventors: Bernhard Goetz, Zaisenhausen; Wilfried Schilling, Kraichtal; Andreas Kleinhans, Bretten-Goelshausen, all of Germany

[73] Assignee: E.G.O. Elektro-Gerätebau GmbH, Germany

[21] Appl. No.: 475,021

[22] Filed: Jun. 6, 1995

[30] Foreign Application Priority Data

Jun. 7, 1994 [DE] Germany .................. 44 19 866.3

[51] Int. Cl.⁶ ............................................ H05B 1/02
[52] U.S. Cl. ................... 219/483; 219/445; 219/449; 219/508; 341/33
[58] Field of Search ........................ 219/443, 448, 219/449, 465, 464, 453, 497, 483, 486, 508, 509; 200/600; 307/112, 116; 341/32, 33

[56] References Cited

U.S. PATENT DOCUMENTS

| | | | |
|---|---|---|---|
| 4,125,783 | 11/1978 | Seften | 307/116 |
| 4,290,052 | 9/1981 | Eichelberger et al. | 340/365 C |
| 4,304,976 | 12/1981 | Gottbreht et al. | 219/10.55 B |
| 4,380,040 | 4/1983 | Posset | 361/280 |
| 5,097,113 | 3/1992 | Aoyama . | |
| 5,308,957 | 5/1994 | Huffington | 219/483 |
| 5,345,807 | 9/1994 | Butts et al. | 74/4 |

FOREIGN PATENT DOCUMENTS

| | | |
|---|---|---|
| 443924 | 8/1991 | European Pat. Off. . |
| 481162 | 4/1992 | European Pat. Off. . |
| 1820520 | 10/1960 | Germany . |
| 2506933 | 9/1976 | Germany . |
| 8530181 | 10/1985 | Germany . |
| 3526992 | 2/1987 | Germany . |
| 3843460 | 6/1990 | Germany . |
| 9112371 | 10/1991 | Germany . |
| 691 00 010 T2 | 3/1993 | Germany . |
| 4229731 | 4/1993 | Germany . |
| 4317040 | 4/1994 | Germany . |

Primary Examiner—Mark H. Paschall
Attorney, Agent, or Firm—Quarles & Brady

[57] ABSTRACT

An electronic control arrangement for an electrical heating appliance with several separately heatable electrical loads, particularly cooking points or hotplates, contains an electronic master switch, which has its own power supply. The master switch is followed by a control unit having for each electrical load in each case one control subunit. For each hotplate the control unit has a temperature sensor, which responds if the control unit becomes too hot at this point.

24 Claims, 3 Drawing Sheets

CONTROL ARRANGEMENT FOR AN ELECTRIC HEATING APPLIANCE

DESCRIPTION

The invention relates to a control arrangement for an electric heating appliance with several loads, particularly a glass ceramic cooking surface with several, separately switchable cooking points or hotplates, which are e.g. heated by radiant heaters.

In the case of glass ceramic cooking surfaces, it is known to switch on and off the individual hotplates with the aid of actuating or operating elements, which are triggered or initiated by contacting or touching a specific point on an operating or actuating field. As a result of touching said fields electronic circuits are activated, which then take over the control of the electric power. A device for regulating the heating position in a cooker using sensor buttons or keys is already known (DE 691 00 010 T2), in which the sensor buttons or keys are stuck to a circuit board below the glass surface. The sensor buttons are formed by the two electrodes of a capacitor, both being located in one plane. To the outer electrode is applied a pulse train, which is capacitively coupled to the other electrode.

The inner electrode is connected to a comparator. If a user alters with his finger the capacitance of the capacitor, this is established by the comparator and can activate or initiate a switching process. The electrode surfaces are surrounded by the copper strips of the electronic circuit, so that for each individual operating surface there are different capacitive couplings, which makes it difficult to evaluate the capacitive useful signal. In practice, each capacitive sensor surface must be adapted to its environment by a specially dimensioned reference voltage. When there are several sensor surfaces this requires a considerable circuit complexity.

Hitherto electronic touch switching means in the form of individual components are known and said means can be juxtaposed.

The problem of the invention is to provide a control arrangement of the aforementioned type, which allows a simplified construction and improved control possibilities.

For solving this problem the invention proposes a control arrangement having the features of claim 1. Further developments of the invention form the subject matter of subclaims.

In particular it can be provided that the sensor surface of each operating element is surrounded by in each case one screening or shielding line, the screening or shielding lines of all the sensor surfaces being applied to a screening or shielding potential, e.g. by means of individual, but equally large resistors to earth or ground. Therefore the influences of the environment on the individual sensor surfaces are substantially the same, so that an identical reference voltage can be used for signal evaluation for all the sensor surfaces.

The invention proposes housing the control unit in a housing stuck to the underside of the glass plate. The sticking or adhesion of the housing, preferably along a closed surface, has the advantage that no moisture on the underside of the glass plate can penetrate the housing, because this would be prejudicial to the correct operation of the sensor elements. It is consequently unnecessary for the circuit board having the sensor units to be stuck to the glass plate.

According to a further development of the invention, the sensor surfaces and shielding lines are placed on a side of a sensor circuit board facing the underside of the glass plate and which is pressed against the latter under spring tension.

According to a further development of the invention the control electronics for the loads activated by the operating elements are placed on at least one circuit board, which is connected by means of electrically conductive spring elements to the sensor circuit board. The said spring elements can assume responsibility for the pressing of the sensor circuit board onto the glass surface and also the current connection. It is particularly favourable if the springs are constructed in SMD technology, which can then be fixed in the same way as standard SMD components. For this purpose the springs can have a planar, flat end, whose shape and size corresponds to a SMD contact point. As a result of the surface tension of the liquid or molten tin solder, during soldering said connection points are aligned.

According to the invention the circuit board receiving the control electronics can be built up from two circuit boards arranged in spaced manner, the connection parts for the sensor surfaces and the indicating or display elements can be placed on the side facing the glass plate of one circuit board, whilst the terminals for the loads and the mains connection can be placed on the other side of the other circuit board. This permits a rapid installation and a rapid connection of the control unit.

For the production of such a two-part circuit board, the invention proposes that the circuit boards initially be constructed as a single element and to carry out the assembly from one side. The circuit board can then be separated along a longitudinal line and one part can be turned around said separating line by 180°. The two parts can then be fixed to one another in this way with spacers or the like.

According to the invention for each electrical load can be provided an indicating or display element, which e.g. displays a set switching stage. For example, these displays can be located on the circuit board of the control electronics facing the glass plate, the sensor circuit board then having an opening so as to render the display element visible. The openings can be laterally displaced or parallax correction. Suitable display elements can in particular be seven-segment displays, which can be activated for displaying numbers, letters and other symbols.

The invention proposes associating with the control unit a main or master switch, which can be connected in series with the control unit in such a way that it switches it on and off. The master switch can either be provided as a separate unit, e.g. positioned on another point of the cooking field, or can be combined as a structural unit with the control unit.

The combination of the individual control subunits hitherto known in the form of individual components in order to form a composite unit permits a simplification of construction. The subdivision into a control unit and a master switch permits an appropriate combination and subdivision of electronic functions. If the control unit is switched off with the aid of the master switch, then e.g. on cleaning the cooker surface there is no activation of processes. It is possible to locate the master switch at a different point to the actual control unit.

According to a further development of the invention during switching on the master switch switches in the control voltage of the control unit following it. Beforehand the entire control unit is consequently inoperative. This is e.g. used for power saving purposes, because for the entire time during which the electric heating device is not used, no current need flow in the control unit.

According to the invention the master switch or its operating element can be constructed in such a way that the latter is only switched on if the operating element is operated by a small object at a specific point. This can e.g. take place in that the operating unit of the master switch is formed by a relatively small central electrode roughly corresponding to a finger tip, a second electrode surrounding the latter and a third electrode surrounding the second electrode. Thus, two capacitors with a common electrode are formed, which can be connected in such a way that only a modification to the capacitance between the inner and the central electrode without changing the capacitance between the central and outer electrode leads to a switching on. The aim of this is that on touching with a large-surface object no switching on can take place, e.g. when wiping the cooker with a cloth. Only if a user places the finger on the centre of the operating element does a switching on take place. This simultaneously provides protection against overflowing cooking matter leading to a switching on.

The invention proposes that the device can have a residual heat display, which as a result of the set control parameters calculates a residual heat and activates a display for as long as the temperature exceeds a specific value.

According to the invention the control arrangement can have a standby circuit with its own power supply. In inactive operation the control unit then receives no power supply, so that it also has no power consumption. The standby circuit only supplies power to the master switch, so that by operating the latter the control unit can be switched on.

According to a further development of the invention the control voltage of the control unit is maintained following the switching off of the final load for as long as a residual heat display shows that at least one of the electrical loads still has a temperature which could be painful in the case of contact for the user of the electric heating appliance. Only when this residual heating display is extinguished on dropping below a given temperature, does the control unit become dead and it remains in this state until it is switched on again through the master switch.

According to the invention it can be provided that the master switch only has a single operating element with the aid of which the voltage supply to the control unit is switched on. As has already been mentioned the switching off of the master switch takes place automatically after cutting out the final load and the delayed cutting out of the residual heat display.

The standby circuit can be constructed in such a way that it also disconnects in all-pole manner the loads in the inactive state. The disconnection of the loads admittedly takes place through the control unit, but further advantages can result from an all-pole separation of the loads by the standby circuit.

According to a further development, the invention proposes that the control unit, as soon as it is supplied with voltage, returns a continuous signal to the master switch. This return or answer-back signal can e.g. be generated as a timing signal by a microprocessor of the control unit. If a fault occurs in the control unit, this leads to the answer-back signal failing or being modified. This process can be used for disconnecting or interrupting the voltage supply to the control unit.

According to a further development the control unit has at least one temperature sensor, preferably each electrical load in its vicinity has its own temperature sensor. Said temperature sensor firstly protects the electronics against overheating as a result of an incorrect operation and secondly protects the person using the cooker. According to the invention the control unit can be constructed in such a way that when a temperature sensor responds the electrical load closest thereto is switched off. The response of the temperature sensor can e.g. be brought about in that a pot standing on an electrical load is so displaced that it is on the contact surface for the associated control unit. In this case there is naturally a risk of the electronics becoming overheated. In addition, the cooker then leads to the heating of a zone, which the cooker user would not expect to be hot.

If the control unit establishes that following the disconnection of one load the temperature does not decrease, it can disconnect all the loads after a certain time.

According to the invention, the control unit for each load has an operating element for switching on and at least one operating element for setting a switching stage, power level, etc. After switching on the cooking field through the master switch, it is consequently necessary to switch on a specific cooking point or hotplate by means of an operating element, so that only then is the corresponding switching stage set by a third process. For this purpose it can e.g. be provided that each switching stage has its own operating element, which is e.g. provided in the form of a straight line or in circular form. In the case of a circular shape the nature of the operation of a conventional rotary switch would be optically simulated.

It is also possible to provide an operating element for raising the switching stage and an operating element for lowering the switching stage. This is particularly advantageous if the switching stage is displayed by a digital display.

When an operating element is provided for each switching stage a display can e.g. take place alongside the particular operating element.

According to the invention an operating element taking over a locking function is associated with the control unit or the master switch, i.e. in the form of a locking key or button. Thus, if it is operated when the cooking field is disconnected, there can be a locking of all the operating elements, so that then no switching on can take place. It can optionally be provided that further sensor surface touching or contact operations must be carried out in order to carry out the locking and/or cancel it out again.

The invention proposes that the control arrangement can have a pot detector, preferably for each hotplate. The per se known pot detector can be used to supply the user with a display that no pot is present or that the pot is not correctly positioned or to prevent a switching on of a hotplate.

According to a further development of the invention the control unit can be constructed in such a way that if a sensor surface is operated for too long, all the loads are switched off and this is then interpreted as an error signal. It is also possible in the case of simultaneous operation of all the operating elements no change to the state is made.

According to a further development, all the safety-relevant system states are multiply stored within the control unit and regularly checked for identity. This makes it possible to detect functional faults and can be used for disconnecting the loads.

Further features, details and advantages can be gathered from the claim, whose content is made by reference part of the description, the following description of a preferred embodiment and the attached drawings, wherein show:

FIG. 1 in simplified form a block diagram of the control arrangement according to the invention.

Figure 2:
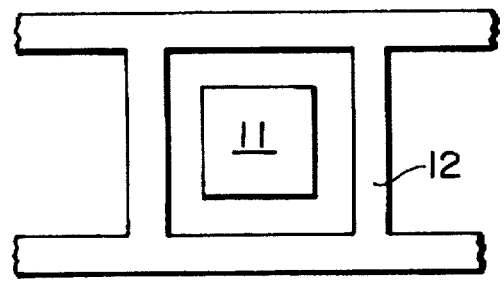

FIG. 2 diagrammatically a shielding line surrounding a sensor element.

Figure 3:
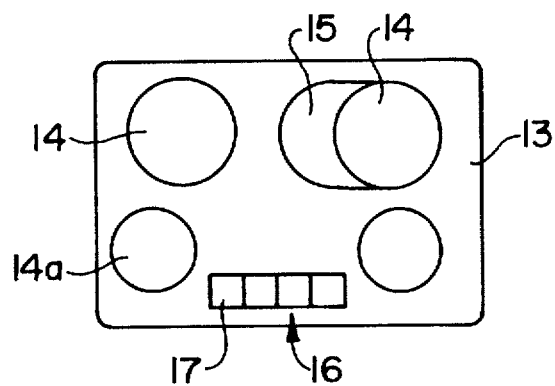

FIG. 3 diagrammatically a plan view of a glass ceramic cooking surface with four cooking points and a control arrangement according to the invention.

Figure 4:
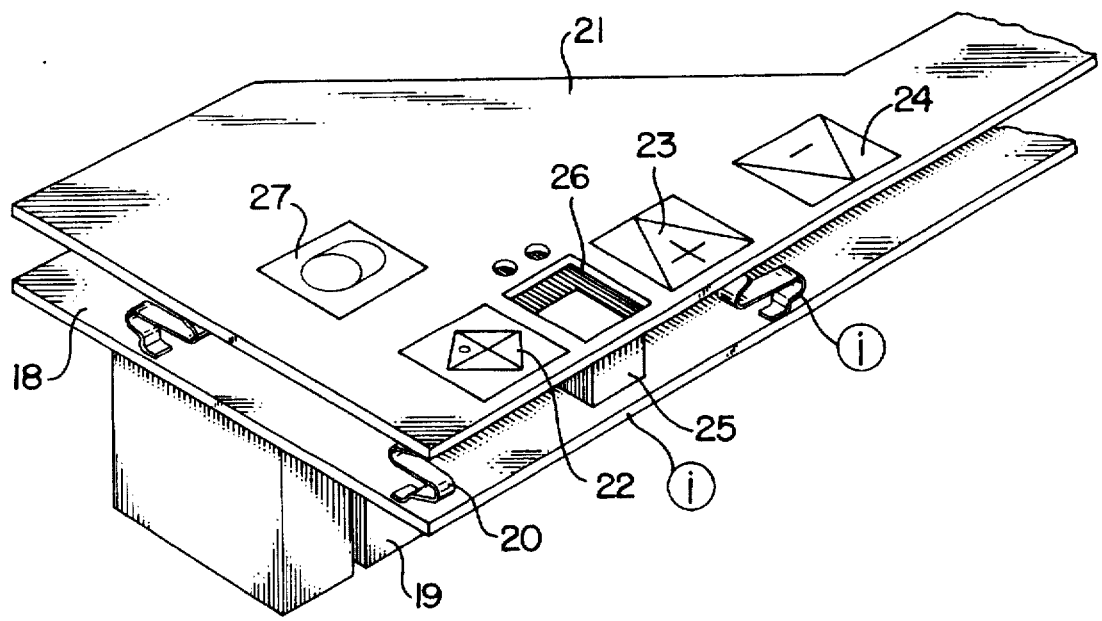

FIG. 4 a perspective partial plan view of the control unit.

Figure 5:
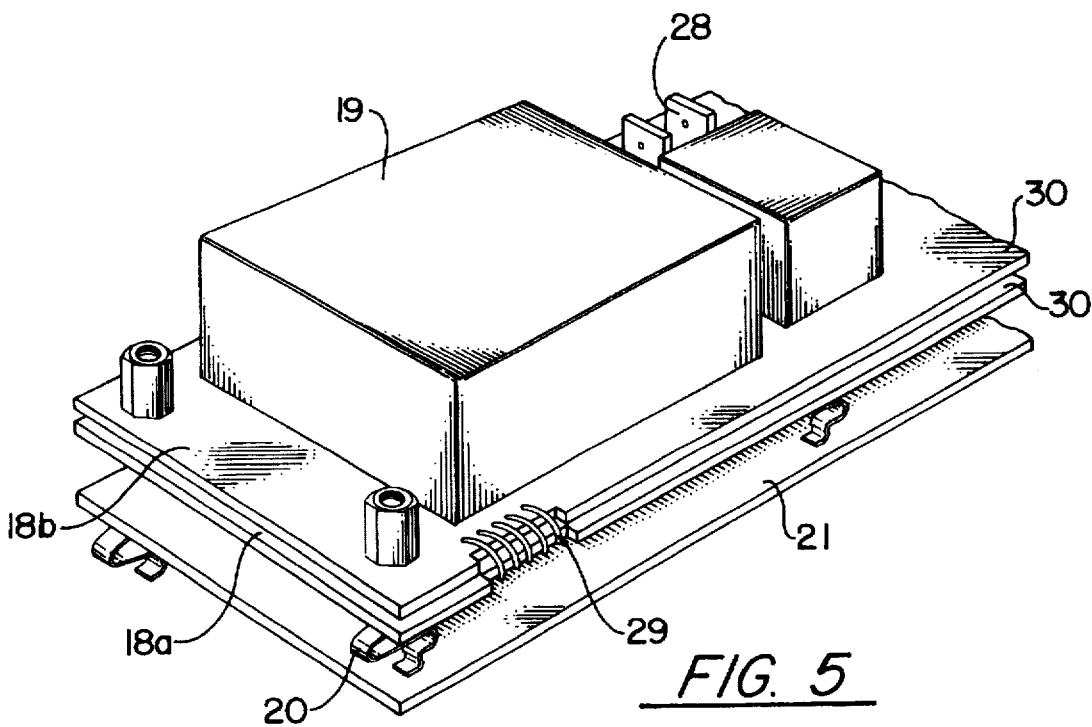

FIG. 5 a perspective partial view of the control unit from below.

Figure 6:
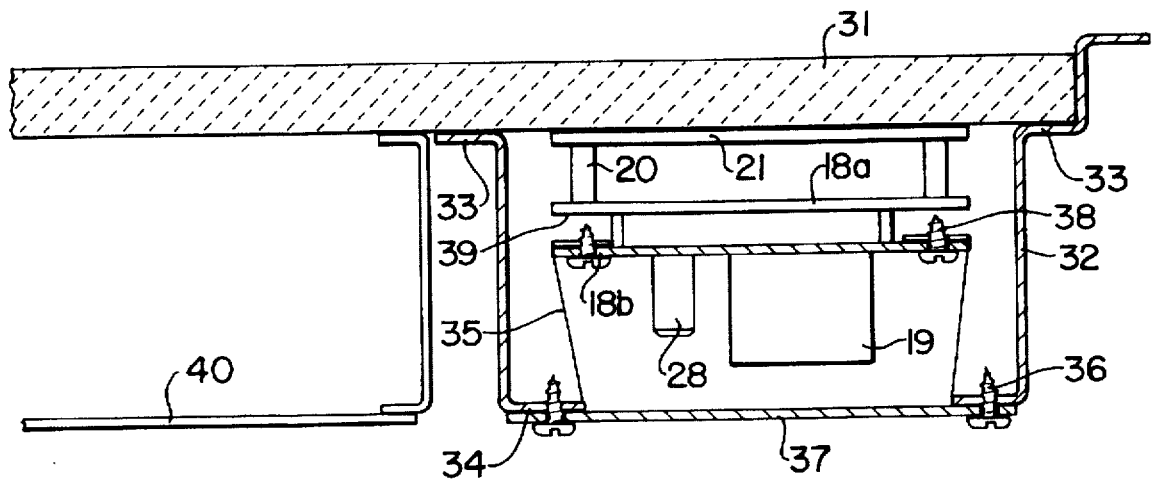

FIG. 6 a section through a cooking field with a control unit arrangement in a housing below the glass plate.

Figure 7:
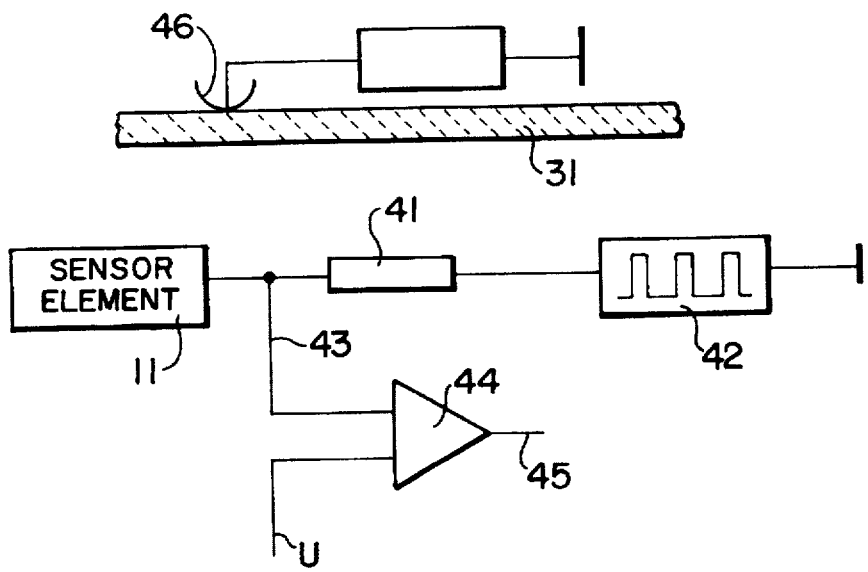

FIG. 7 the circuit diagram of the operating process.

Figure 8:

FIG. 8 two display states of a pot detection system with the aid of a seven-segment display.

The control arrangement diagrammatically shown in FIG. 1 has at the left two connections or terminals for a voltage supply. The control arrangement contains a main or master switch 2, which is identified by the symbol 3 for a switch. This switch is constructed as an electronic switching element. For its operation the master switch 2 contains an operating element 4, which is e.g. a touch switch and is represented by a touch field.

The master switch is followed by a control unit 5, which is used for activating the individual electrical loads. This is represented by lines 6 indicated by the arrows. The control unit 5 internally contains four control subunits 7, which in each case have one or more operating elements 8 for the associated electrical loads. For example there can be a key or button for increasing and a key or button for decreasing the power level. These four identically constructed control subunits 7 are combined in the control unit 5.

Between the master switch 2 and the control unit 5 is provided a further control line 9 informing the control unit 5 that the master switch 2 has been switched on.

The control unit 5 indicates its operation back to the master switch 2 via an answer-back line 10. For example on said line is returned a timed signal, whose drop-out indicates that the control unit 5 is not functioning correctly. In this case the master switch 2 disconnects the power supply to all the electrical loads. In the control unit 5 only that part which operates the residual heat display is supplied with power.

FIG. 2 is a diagrammatic arrangement of a sensor element 11, which is in each case associated with one operating element 8 of the four control subunits 7. The sensor element is surrounded by a shielding or screening conductor 12, which continues in both directions to the sensor elements of the other operating elements 8 and is jointly applied by means of a resistor to earth or ground. Thus, there is a shielding of each sensor element 11 and therefore each operating element 8 with respect to the other operating elements.

FIG. 3 is a plan view of a glass ceramic cooking surface 13 with four cooking points or hotplates 14, which e.g. have radiant heaters. A hotplate 14 contains a field 15 which can be switched in.

On the front the touch field 16 of the control unit 5 is located in the glass ceramic cooking surface. The control unit 5 is positioned directly and with a limited spacing below the glass ceramic cooking surface. The operating field 16 in each case contains one subfield 17 for each hotplate 14. The control unit 5, which is associated with the arrangement of FIG. 3, contains e.g. two temperature sensors, whereof one is located in the vicinity of the left-hand end and the other in the vicinity of the right-hand end. If e.g. the left temperature sensor indicates an excessive temperature, this can be a sign that a hot pot has been laterally displaced on the immediately adjacent hotplate 14a, so that it is positioned above the associated operating field 17 of the control unit 5. In this case the control unit 5 disconnects the power supply to this hotplate 14a. If, following the disconnection of the power supply, there is no decrease in the temperature indicated by the associated temperature sensor, then after a certain time all the hotplates 14 are switched off.

FIG. 4 perspectively shows part of the control unit 5, which contains a circuit board 18 on which are housed individual components of the control electronics and including e.g. a mains transformer 19. On the top of the circuit board 18, i.e. the side facing the underside of the glass ceramic plate, several springs 20 bent in zig-zag manner are fixed, e.g. by soldering to the circuit board 18. At the other end, i.e. the upper end in FIG. 4, said springs are connected to contact surfaces of a further circuit board 21. For each electrical load said circuit board 21 contains a first sensor surface 22, which is used for switching on the corresponding load. In addition, there is a second sensor surface 23 for increasing the switching stage and a third sensor surface 24 for decreasing the switching stage.

The power supply between the control electronics located on the circuit board 18 and the conductive sensor surfaces 22 to 24 takes place by means of the springs 20.

The circuit board 18 for the control electronics visible in FIG. 4 has on its top a seven-segment display 25. At this point the sensor circuit board 21 has an opening 26, which has the same rectangular shape as the display 25, but is positioned in a somewhat staggered manner for parallax correction purposes.

The sensor circuit board 21 can also have decorative elements, e.g. the symbol 27 for switching in an additional heating surface.

FIG. 5 shows the arrangement of FIG. 4 perspectively from below, the circuit board 18 for the control electronics being formed from two circuit board parts 18a, 18b, which are arranged in parallel at a certain distance from one another. On the top of the circuit board part 18b in FIG. 5, i.e. a function of the lower plate, are provided flat insertion tongues 28 for the connection of the mains lead. If the control unit of FIG. 5, containing the two circuit board parts 18a, 18b and the sensor circuit board 21, is fitted in the represented and described manner to the underside of a glass ceramic surface, then the flat insertion tongues 28 are directed downwards, so that the connection to a mains cable can take place in simple manner.

Between the two circuit board parts 18a, 18b are provided several connecting wires 29, which not only form an electrical connection between the two parts, but also provide a mechanical connection.

The two circuit board parts 18a, 18b are initially manufactured as a single circuit board and assembled from one side. After completing the assembly they are separated along a line forming one of the longitudinal edges 30 and are combined around said line, so that now the assembly is in each case located on the outsides.

FIG. 6 shows the fitting of the control unit 5 to the underside of a glass plate 31. For housing the control unit 5 a sheet metal housing 32 is provided, which has along its upper edge a flange 33 located in one plane. On the surface of said flange 33, which to the right is constructed as a shoulder, is stuck with the aid of a silicone adhesive or the like the housing 32 on the underside of the glass plate 31. The adhesion point forms a closed, planar border, so that the housing 32 at the connection point to the glass ceramic plate 31 is protected against the penetration of moisture at this point.

On its underside the housing 32 has an opening, which is surrounded by a planar border 34, to which is fixed with the aid of the clips 35 the control unit 5. The clips 35 have a roughly Z-shape and at their lower ends are screwed with the aid of screws 36 to the marginal flange 34. The screws 36 can be simultaneously used for screwing down a cover plate 37.

The upper ends of the clips 35 are bent round the edges of the circuit board 18b and are screwed down there with the aid of further screws 38. The edges of the circuit board 18b can have notches used for housing the clips 35.

Above the circuit board 18b is provided the circuit board part 18a, which is kept spaced with the aid of the spacers 39. The springs 20 press the sensor circuit board 21 against the underside of the glass plate 31.

Following the application of the cover 37 the housing 32 is closed and the entire control unit 5 is placed on the underside of the glass plate in mechanically secure manner so that no moisture can penetrate. At a certain distance from the housing 32 is provided a further housing 40 for housing the heaters of the glass ceramic cooking field.

FIG. 7 diagrammatically shows the circuit diagram for initiating an operating process. The sensor element 11 is placed on the underside of the glass plate 31. It is formed by a metallically conductive coating on the sensor circuit board 21. The sensor element 11 can be surrounded by a shielding line 12, which is shown in FIG. 2 and omitted here for simplification reasons. The sensor element 11 is connected by means of an impedance 41 to a pulse generator 42, which emits square-wave pulses. The sensor element 11 is connected by means of a further line 43 to one input of a comparator 44. The other input of the comparator 44 is at a clearly defined voltage U.

A signal voltage of a particular form is applied to the output 45 of the comparator 44. If a user approaches the sensor the element 11 with the finger 46, as a result of the modified conditions the shape of the signal at the output of the comparator 44 changes. As the comparator 44 compares the signal at its input 43 with a constant, fixed reference voltage, on approaching the sensor element 11 there is a change in the pulse width of the pulse trains at the output 45 of the comparator 44. On touching the glass ceramic plate 31 above the sensor element 11 the pulses at the comparator output become narrower. This signal change is then used for activating control processes.

The control unit 5 can contain a pot detection circuit. FIG. 8 shows a seven-segment display, which at the left activates the upper half of the seven-segment display in U-shaped manner and activates the lower half with a lower bar. The right-hand half of FIG. 8 shows the U in the lower part of the seven-segment display, which is intended to represent a correctly positioned pot. Particularly in the case of a switching backwards and forwards between the two symbols it becomes clear to the user that the cooking pot is not correctly placed on the hotplate.

The described apparatus shown in the drawings functions in the following way. The cooking field is switched on by operating the touch field 4 of the master switch 2. This touch field 4 must be touched in a relatively closely defined zone without touching the surrounding area. The aim is to avoid a wiping of the surface unintentionally bringing about a switching on. The master switch 2 switches on the following control unit 5, in which initially all the electrical loads are disconnected. For activating an electrical load it is firstly necessary to render active the associated control subunit 7 by operating the sensor field 22, cf. FIG. 4 and then the electrical load can be brought to a given switching stage by operating the sensor field 23.

By means of the answer-back line 10, the control unit 5 indicates to the master switch 2 that it is operating correctly. For this purpose it emits a continuous pulse train on this line. As soon as this pulse train is disturbed, i.e. completely stops or undergoes a frequency change, the control of the master switch 2 detects that there is a fault and switches off the control unit 5. It is also possible to have an all-pole separation of the electrical loads from the mains.

If all the electrical loads of the cooking field are switched off, the control unit 5 remains in operation until a residual heat display no longer functions. The power supply of the control unit 5 is then disconnected and only the master switch 2 operates on a standby basis.

We claim:

1. A control arrangement for an electrical heating appliance having a glass cooking plate and plurality of separately operable electrical heating units disposed below the glass cooking plate for heating respective areas of the glass cooking plate, the control arrangement comprising:

a control unit having a control subunit for each of the electrical heating units, each of the control subunits having at least one operating unit;

each of the operating units having: an electrically conductive sensor surface positioned below the glass cooking plate; a pulse generator supplying pulses through an impedance; and, a comparator having a first input coupled to said sensor and to said impedance and having a second input coupled to a reference, the comparator generating an output signal which changes when the sensor surface is engaged; and, the sensor surface of each operating element being surrounded by a shielding conductor, all of the shielding conductors being coupled to a common shielding potential.

2. A control arrangement according to claim 1, wherein the control unit is located in a housing adhered to the underside of the glass cooking plate.

3. A control arrangement according to claim 1, wherein the sensor surfaces and the shielding conductors are placed on a sensor circuit board facing the underside of the glass cooking plate, on the side thereof facing the glass cooking plate, the sensor circuit board being resiliently pressed against the glass cooking plate.

4. A control arrangement according to claim 3, comprising:

control electronics for the electrical heating units responsive to the operating units:

at least one more circuit board for mounting the control electronics; and electrically conductive springs mounted on the one more circuit board and pressing the sensor board against the glass cooking plate.

5. A control arrangement according to claim 4, wherein the springs are surface mounted on the one more circuit board.

6. A control arrangement according to claim 5, wherein the one more circuit board for the control electronics is formed from two spaced circuit board parts, the sensor surfaces and the display elements having terminals positioned on the side of one circuit board part directed towards the glass plate and the electrical heating units having terminals on the other side of the other circuit board part, together with the mains terminals.

7. A control arrangement according to claim 4, wherein the one more circuit board for the control electronics has a display element for each of the electrical heating units, which is visible through an opening in the sensor circuit board, and has mains terminals.

8. A control arrangement according to claim 1, wherein the control unit has at least one temperature sensor.

9. A control arrangement according to claim 8, wherein the control unit has a temperature sensor for each of the electrical heating units.

10. A control arrangement according to claim 8, wherein the control unit comprises a circuit responsive to the at least one temperature sensor for disconnecting that one of the electrical heating units closest to the at least one temperature sensor.

11. A control arrangement according to claim 10, wherein the circuit in the control unit disconnects all the electrical heating units if the sensed temperature does not decrease after the closest electrical heating unit is disconnected.

12. A control arrangement according to claim 1, further comprising a master switch coupled to the control unit by a control line and an answer-back line, the control unit supplying a continuous pulse signal on the answer-back line during normal operation.

13. A control arrangement according to claim 1, wherein the master switch comprises a single operating element.

14. A control arrangement according to claim 12, wherein the operating element of the master switch is operable only in response to activation of a sensor having a small actuating zone.

15. A control arrangement according to claim 1, further comprising a residual heat display, active for as long as the temperature exceeds a given value.

16. A control arrangement according to claim 1, further comprising a standby circuit and a standby power supply for the standby circuit.

17. A control arrangement according to claim 16, wherein the standby circuit disconnects the control unit only if the residual heat display is below the given value.

18. A control arrangement according to claim 16, wherein the standby circuit disconnects all mains supply terminals to the electrical heating units.

19. A control arrangement according to claim 1, wherein each of the control units comprises a first operating element for switching on its respective electrical heating element and at least one further operating element for setting a switching threshold.

20. A control arrangement according to claim 19, wherein each of the control subunits has an operating element for raising the switching threshold and an operating element for lowering the switching threshold.

21. A control arrangement according to claim 1, where each of the control subunits comprises a cooking pot detector.

22. A control arrangement according to claim 1, wherein the control unit disconnects all of the electrical heating units if operation of any operating element is interrupted for a predetermined period of time.

23. A control arrangement according to claim 1, wherein the control unit is not responsive to simultaneous operation of a plurality of the operating elements.

24. A control arrangement for an electrical heating appliance having a glass cooking plate and plurality of separately operable electrical heating units disposed below the glass cooking plate for heating respective areas of the glass cooking plate, the control arrangement comprising:

a control unit having a control subunit for each of the electrical heating units, each of the control subunits having at least one operating unit;

each of the operating units having an electrically conductive sensor surface positioned below the glass cooking plate and a circuit generating an output signal which changes when the sensor surface is engaged; and, the sensor surface of each operating element being surrounded by a shielding conductor, all of the shielding conductors being coupled to a common shielding potential.

* * * * *